United States Patent
Na (10) Patent No.: US 10,840,123 B2
(45) Date of Patent: Nov. 17, 2020

(54) SUBSTRATE TREATMENT DEVICE PROVIDING IMPROVED DETACHMENT MECHANISM BETWEEN SUBSTRATE AND STAGE AND SUBSTRATE TREATMENT METHOD PERFORMED USING THE SAME

(71) Applicant: SAMSUNG DISPLAY CO., LTD., Yongin-si (KR)

(72) Inventor: Heungyeol Na, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 357 days.

(21) Appl. No.: 15/820,120

(22) Filed: Nov. 21, 2017

(65) Prior Publication Data

US 2018/0261493 A1 Sep. 13, 2018

(30) Foreign Application Priority Data

Mar. 10, 2017 (KR) ......................... 10-2017-0030536

(51) Int. Cl.
| | |
|---|---|
| *H01L 21/687* | (2006.01) |
| *B24B 37/34* | (2012.01) |
| *B24B 37/10* | (2012.01) |
| *H01L 21/306* | (2006.01) |
| *H01L 21/683* | (2006.01) |

(52) U.S. Cl.
CPC ........ *H01L 21/68742* (2013.01); *B24B 37/10* (2013.01); *B24B 37/345* (2013.01); *H01L 21/30625* (2013.01); *H01L 21/6838* (2013.01)

(58) Field of Classification Search
None
See application file for complete search history.

(56) References Cited

U.S. PATENT DOCUMENTS

| | | | | |
|---|---|---|---|---|
| 6,099,697 A | * | 8/2000 | Hausmann | H01L 21/6831 204/192.12 |
| 6,558,228 B1 | * | 5/2003 | Cheng | B24B 37/30 257/E21.23 |
| 7,850,815 B2 | * | 12/2010 | Kaizu | B32B 37/0046 156/104 |
| 8,057,602 B2 | | 11/2011 | Koelmel et al. | |
| 2006/0211181 A1 | | 9/2006 | Chung | |
| 2009/0040682 A1 | * | 2/2009 | Park | H01L 21/6831 361/234 |
| 2010/0101771 A1 | * | 4/2010 | Roy | H01L 21/67109 165/247 |
| 2010/0248490 A1 | * | 9/2010 | McMillin | H01J 37/32788 438/716 |
| 2011/0058302 A1 | * | 3/2011 | Valcore, Jr. | H01L 21/67069 361/234 |

(Continued)

FOREIGN PATENT DOCUMENTS

KR  10-2010-0111298  10/2010

*Primary Examiner* — Allan W. Olsen
(74) *Attorney, Agent, or Firm* — F. Chau & Associates, LLC (57) ABSTRACT

A substrate treatment method performed by a substrate treatment device includes placing a substrate on a stage, treating the substrate placed on the stage; and detaching a treated substrate from a stage. Detaching the treated substrate includes pushing the substrate with a lift pin in a direction away from the stage, and ejecting fluid through a fluid ejection unit onto the substrate in a direction away from the stage.

6 Claims, 6 Drawing Sheets

(56) References Cited

U.S. PATENT DOCUMENTS

| | | | |
|---|---|---|---|
| 2013/0014371 A1* | 1/2013 | Povolny | H01L 21/6831 |
| | | | 29/426.5 |
| 2016/0172227 A1* | 6/2016 | Hanson | H02N 13/00 |
| | | | 361/234 |
| 2017/0352565 A1* | 12/2017 | Zhang | H01J 37/32697 |
| 2018/0122679 A1* | 5/2018 | Roy | H01L 21/67248 |
| 2019/0237352 A1* | 8/2019 | Kumar | H01L 21/3065 |
| 2020/0020564 A1* | 1/2020 | Liu | H01L 21/67253 |

* cited by examiner

SUBSTRATE TREATMENT DEVICE PROVIDING IMPROVED DETACHMENT MECHANISM BETWEEN SUBSTRATE AND STAGE AND SUBSTRATE TREATMENT METHOD PERFORMED USING THE SAME

CROSS-REFERENCE TO RELATED APPLICATION

This application claims priority under 35 U.S.C. § 119 from, and the benefit of, Korean Patent Application No. 10-2017-0030536, filed on Mar. 10, 2017 in the Korean Intellectual Property Office, the contents of which are herein incorporated by reference in their entirety.

BACKGROUND

1. Technical Field

One or more exemplary embodiments are directed to a substrate treatment device such as a chemical mechanical polishing device and a substrate treatment method performed using the same.

2. Discussion of the Related Art

A substrate treatment device, such as a chemical mechanical polishing device, performs an operation in which a substrate to be polished is placed on a stage, a surface of the substrate is polished by a chemical mechanical method, and then the polished substrate is taken off the stage and sent to the next process.

However, when performing such a polishing operation, adhesion between a substrate and a stage significantly increases due to pressure and heat acting on the substrate during the polishing operation. This can make it challenging to subsequently lift the substrate off the stage. In particular, a large-area substrate such as a large-sized display substrate has an adhesion whose strength is proportion to the area, and there is a risk of the substrate breaking during the detachment process.

SUMMARY

One or more exemplary embodiments can provide an improved substrate treatment device that performs a detaching operation between a substrate and a stage more smoothly and a substrate treatment method performed using the same.

Additional aspects will be set forth in part in the description which follows and, in part, will be apparent from the description, or may be learned by practice of the presented exemplary embodiments.

According to one or more exemplary embodiments, a substrate treatment device includes: a stage that receives a substrate, a treatment mechanism that treats a substrate placed on the stage, and a detachment mechanism that detaches the substrate from the stage. The detachment mechanism includes: a lift pin that pushes the substrate in a direction away from the stage; and a fluid ejection unit that ejects fluid toward substrate in a direction away from the stage.

The fluid ejection unit may include a plurality of spray nozzles that face the substrate placed on the stage, and a plurality of fluid lines that supply fluid to the plurality of spray nozzles.

The substrate treatment device may further include a plurality of lift pins and a plurality of fluid ejection units, respectively, and each of the plurality of lift pins is surrounded by the plurality of spray nozzles of a corresponding fluid ejection unit.

The fluid may include water.

The substrate may include a display substrate having a display area and a dummy area. The lift pin and the fluid ejection unit may be disposed to correspond to the dummy area.

The treatment mechanism may include polishing pads that polish a surface of the substrate placed on the stage, a polishing head that rotates the polishing pads, and a reciprocating slider that moves the polishing head back and forth along the stage.

The substrate treatment device may further include a slurry supply and a water supply that respectively supply slurry and water to the surface of the substrate being polished by the polishing pads.

A surface of the stage on which the substrate is placed may include a urethane material.

According to one or more exemplary embodiments, a substrate treatment method includes: placing a substrate on a stage, treating the substrate placed on the stage, and detaching the treated substrate from the stage. Detaching the treated substrate from the stage includes: pushing the substrate with a lift pin in a direction away from the stage; and ejecting fluid through a fluid ejection unit toward the substrate in a direction away from the stage.

Pushing the lift pin and ejecting the fluid may start simultaneously during the detaching.

Pushing the lift pin and ejecting the fluid may start at different times during the detaching.

The lift pin and the fluid ejection unit may include a plurality of lift pins and a plurality of fluid ejection units, respectively, that are provided to correspond to a plurality of locations of the substrate, and pushing the lift pins and ejecting the fluid may start simultaneously at the plurality of locations during the detaching.

The lift pin and the fluid ejection unit may include a plurality of lift pins and a plurality of fluid ejection units, respectively, that may be provided to correspond to a plurality of locations of the substrate, and pushing the lift pins and ejecting the fluid may start at different times at the plurality of locations during the detaching.

Treating the substrate may include polishing a surface of the substrate with polishing pads during a chemical mechanical polishing operation while supplying slurry and water.

According to one or more exemplary embodiments, a substrate treatment device includes a stage that receives a substrate; and a detachment mechanism that detaches the substrate from the stage. The detachment mechanism includes a plurality of lift pins that push the substrate in a direction away from the stage; and a plurality of fluid ejection units that ejects fluid toward the substrate in a direction away from the stage. Each fluid ejection unit comprises a plurality of spray nozzles that face the substrate placed on the stage, and each of the lift pins is surrounded by the plurality of spray nozzles of a corresponding fluid ejection unit.

Each fluid ejection unit may further comprise a plurality of fluid lines that supplies fluid to the plurality of spray nozzles.

The fluid may comprise water.

The substrate may include a display substrate having a display area and a dummy area. The plurality of lift pins and the plurality of fluid ejection units are disposed to correspond to the dummy area.

The substrate treatment device may further include a treatment mechanism that treats a substrate placed on the stage. The treatment mechanism includes polishing pads that polish a surface of the substrate placed on the stage, a polishing head that rotates the polishing pads, a reciprocating slider that moves the polishing head back and forth along the stage, and a slurry supply and a water supply that respectively supply slurry and water to the surface of the substrate being polished by the polishing pads.

A surface of the stage on which the substrate is placed may include a urethane material.

DETAILED DESCRIPTION

As embodiments of the present disclosure allow for various changes and numerous embodiments, exemplary embodiments will be illustrated in the drawings and described in detail in the written description. An effect and a characteristic of the present disclosure, and a method of accomplishing these will be apparent when referring to embodiments described with reference to the drawings. This present disclosure may, however, be embodied in many different forms and should not be construed as limited to the embodiments set forth herein.

Reference will now be made in detail to exemplary embodiments, examples of which are illustrated in the accompanying drawings, wherein like reference numerals may refer to like elements throughout, and repeated description thereof is omitted.

Sizes of elements in the drawings may be exaggerated for convenience of explanation.

Figure 1:
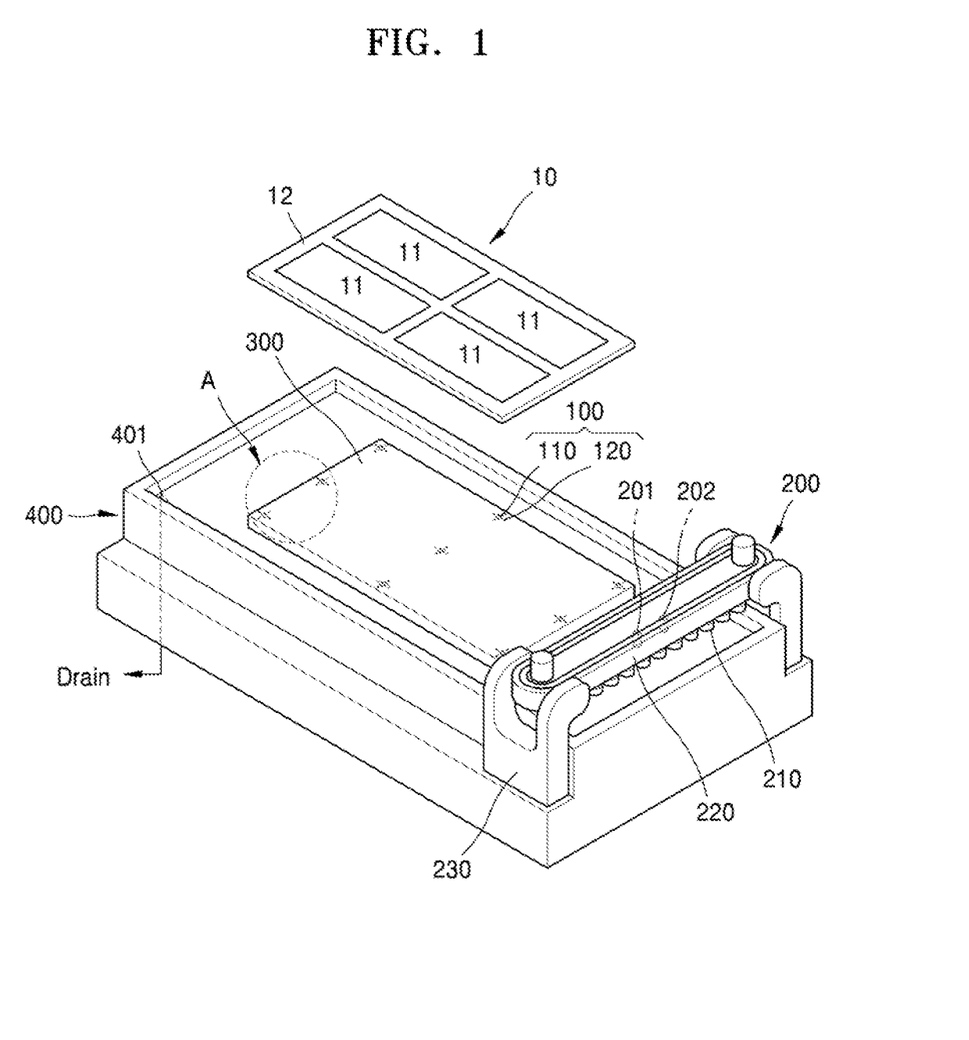
FIG. 1 is a perspective view of a substrate treatment device according to an exemplary embodiment of the present disclosure.

FIG. 1 is a view of a structure of a substrate treatment device, according to an exemplary embodiment of the present disclosure.

A substrate treatment device performs chemical mechanical polishing. A substrate treatment device according to an embodiment includes a stage 300 on an upper surface of a main body 400 so that a substrate 10 to be treated may be placed thereon, a treatment mechanism 200 for polishing a surface of the substrate 10 while moving back and forth along the stage 300, a detachment mechanism 100 that can lift the treated substrate 10 from the stage 300, etc.

First, according to an embodiment, the stage 300 supports the substrate 10 to be treated and a surface of the stage 300 that directly contacts the substrate 10 includes a non-rigid material, such as urethane. According to an embodiment, the substrate 10 is a large-sized display substrate having a plurality of display areas 11 and a dummy area 12 surrounding the display areas 11. Cutting is performed for each display area 11 in a final product, but the substrate 10 may be treated in an original state before cutting. An internal structure of the display area 11 will be described below.

According to an embodiment, the treatment mechanism 200 includes a plurality of polishing pads 210 that can polish the surface of the substrate 10, a polishing head 220 that rotates the polishing pads 210, and a reciprocating slider 230 that moves the polishing head 220 back and forth along the stage 300. Therefore, when the treatment mechanism 200 is operated, a plurality of polishing pads 210 are turned and rotated to polish the surface of the substrate 10, and the reciprocating slider 230 moves the polishing head 220 back and forth so that the entire area of the substrate 10 can be polished. Reference numerals 201 and 202 denote a slurry supply and a water supply, respectively, that supply slurry and water to the periphery of the polishing pads 210 during treatment. Reference numeral 401 denotes a drain hole provided in the main body 400 that allows the used slurry and water to escape.

Figure 2:
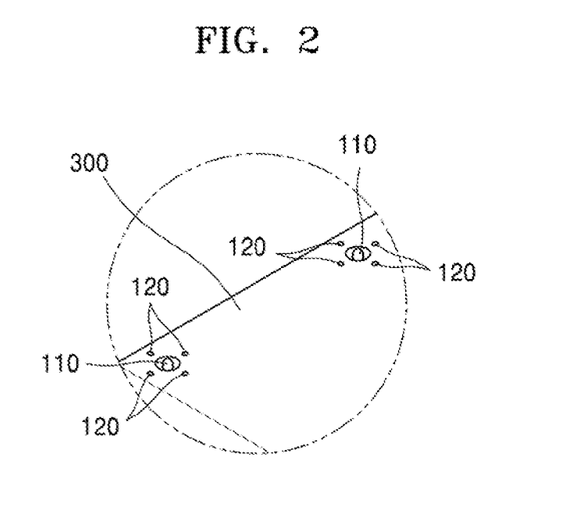
FIG. 2 is an enlarged perspective view of a portion A in FIG. 1.
Figure 3:
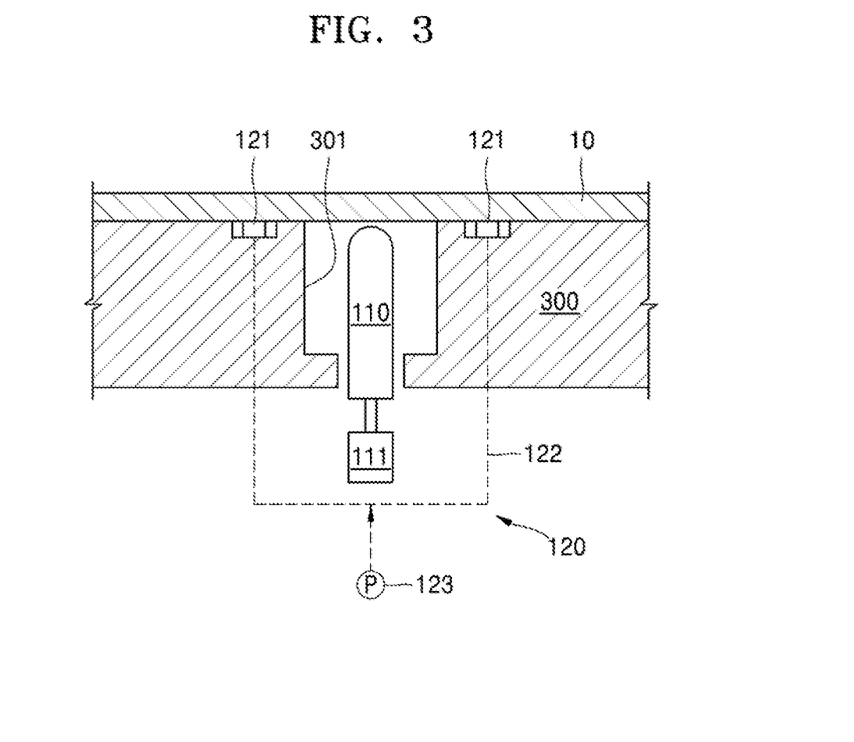
FIG. 3 is a cross-sectional view of a structure of a detachment mechanism of a substrate treatment device of FIG. 1.

In addition, according to an embodiment, the detachment mechanism 100 can smoothly and safely lift the substrate 10, which is in close contact with the surface of the stage 300, after polishing and includes a plurality of lift pins 110 and a plurality of fluid ejection units 120, as illustrated in FIGS. 1 to 3.

According to an embodiment, the lift pins 110 are hidden in a receiving hole 301 of the stage 300 before a detaching operation, and are protruded above the stage 300 by the actuator 111 during the detaching operation to push the substrate 10 up from the stage 300. The lift pins 110 are disposed at a plurality of locations that correspond to the dummy area 12 of the substrate 10. That is, if a pushing pressure of the lift pins 110 is directly applied to the display area 11, the display area 11 may be damaged during the detaching operation. Therefore, the lift pins 110 are directly applied to the dummy area 12, which is a non-display area.

According to an embodiment, as illustrated in FIG. 3, each of the fluid ejection units 120 includes spray nozzles 121, a fluid line 122 that supplies fluid to the spray nozzles 121, and a fluid supply pump 123, and a plurality of spray nozzles 121 surround each of the lift pins 110. The spray nozzles 121 are also disposed at locations that correspond to the dummy area 12 of the substrate 10. When fluid is supplied along the fluid line 122 while the fluid supply pump 123 is operated, the fluid is ejected toward the substrate 10 through the spray nozzles 121 and the substrate 10 is detached from the stage 300 by a force of the fluid.

That is, according to an embodiment, when the detaching operation starts, the lift pins 110 and the fluid ejection unit 120 are simultaneously operated to apply the pushing pressure and the ejection force to the substrate 10 to facilitate the detachment. Water may be used as the fluid ejected through the spray nozzles 121, and the ejected water is discharged through the drain hole 401.

A substrate treatment process that uses the treatment mechanism 200 and the detachment mechanism 100 will be described below. First, according to an embodiment, a structure of an organic light-emitting display (OLED)

device, which is an example of a display area 11 of the substrate 10, will be briefly described with reference to FIG. 7.

Figure 7:
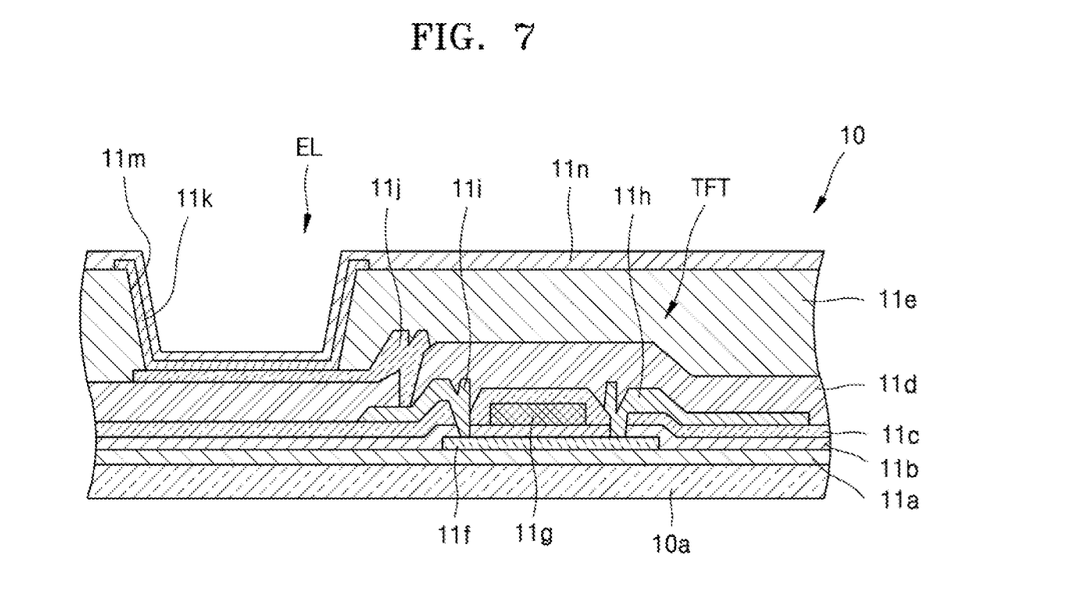
FIG. 7 is a cross-sectional view of a structure of an organic light-emitting display device that is an example of a substrate treated by a substrate treatment device of the present disclosure.

According to an embodiment, as shown in FIG. 7, an OLED display has a structure that includes a thin-film transistor TFT and an organic light-emitting diode EL formed on a substrate 10$a$. In more detail, an active layer 11$f$ is formed on a buffer layer 11$a$ on the substrate 10$a$. The active layer 11$f$ has a source and drain area doped with a high concentration of N-type or P-type impurities. The active layer 11$f$ is formed of an oxide semiconductor. For example, the oxide semiconductor may include an oxide of a material selected from metal elements of groups 12, 13, and 14, such as zinc (Zn), indium (In), gallium (Ga), tin (Sn), cadmium (Cd), germanium (Ge), or hafnium (Hf), or a combination thereof. For example, an active layer 141$f$ may include G-I-Z-O [$(In_2O_3)a(Ga_2O_3)b(ZnO)c$], where a, b and c are real numbers that satisfy conditions of a≥20, b≥0, c>0, respectively. A gate electrode 11$g$ is formed on the active layer 11$f$ with a gate insulating layer 11$b$ interposed therebetween. A source electrode 11$h$ and a drain electrode 11$i$ are formed in a layer on either side of the gate electrode 11$g$. An interlayer insulating layer 11$c$ is provided among the gate electrode 11$g$, the source electrode 11$h$, and the drain electrode 11$i$, and a passivation layer 11$d$ is disposed over the gate electrode 11$g$ and between the source and drain electrodes 11$h$, 11$i$ and an anode electrode 11$j$ of the organic light-emitting diode EL.

According to an embodiment, an insulating planarization layer 11$e$ is formed on the anode electrode 11$j$, and the organic light-emitting diode EL is formed after an opening 11$m$ is formed in the planarization layer 11$e$.

According to an embodiment, the organic light-emitting diode EL emits red, green, and blue light according to a current flow to display image information. The organic light-emitting diode EL includes the anode electrode 11$j$ connected to the drain electrode 11$i$ of the thin-film transistor TFT and supplied with a positive power from the drain electrode 11$i$, a cathode electrode 11$n$ that covers all pixels to supply a negative power, and a luminescent layer 11$k$ disposed between the two electrodes 11$j$ and 11$n$ that emits light.

According to an embodiment, a hole injection layer, a hole transport layer, an electron transport layer, and an electron injection layer are stacked adjacent to the luminescent layer 11$k$.

According to an embodiment, the luminescent layer 11$k$ can be formed separately for each pixel so that pixels that emit red, green, and blue light are gathered to form one unit pixel. Alternatively, a luminescent layer can be formed in common over the entire pixel area regardless of pixel locations. According to an embodiment, the luminescent layer can be formed by vertically stacking or mixing layers that include luminescent materials that emit, e.g., red, green, and blue light. In addition, there can be other color combinations, which can emit white light. Furthermore, the luminescent layer 11$k$ may include a color-conversion layer or a color filter that converts white light into a prescribed color.

According to an embodiment, the luminescent layer 11$k$ is very vulnerable to moisture, and a thin-film encapsulation layer in which an organic layer and an inorganic layer are alternately stacked can be formed over the cathode electrode 11$n$ to protect the luminescent layer 11$k$.

According to an embodiment, during a process of stacking the layers of an OLED device, a crystallization process that uses a laser can be performed to form the active layer 11$f$. That is, after an amorphous silicon layer is formed on the buffer layer 11$a$, the amorphous silicon layer is crystallized by laser annealing to be used as an active layer. At this time, protrusions may form on the surface due to an increase in volume. In this state, an organic light-emitting diode EL cannot perform properly, so a polishing operation that eliminates the protrusions on the surface is needed. A substrate treatment device can be used for the polishing operation. That is, after the amorphous silicon layer is crystallized by a laser, the protrusions on the surface can be removed by chemical mechanical polishing by a substrate treatment device before being patterned to form the active layer 11$f$.

However, according to an embodiment, a substrate treatment device may be used not only for polishing the amorphous silicon layer for the active layer 11$f$, but also for flattening a surface of a general semiconductor wafer. However, it should be understood that the large-sized display substrate 10 having display areas 11 implemented therein is shown as an example of an OLED device.

Now, according to an embodiment, a process of using a substrate treatment device of the present exemplary embodiment to stably and smoothly polish and detach the substrate 10 with the plurality of display areas 11 will be described with reference to FIGS. 4A to 6B.

Figure 4A:
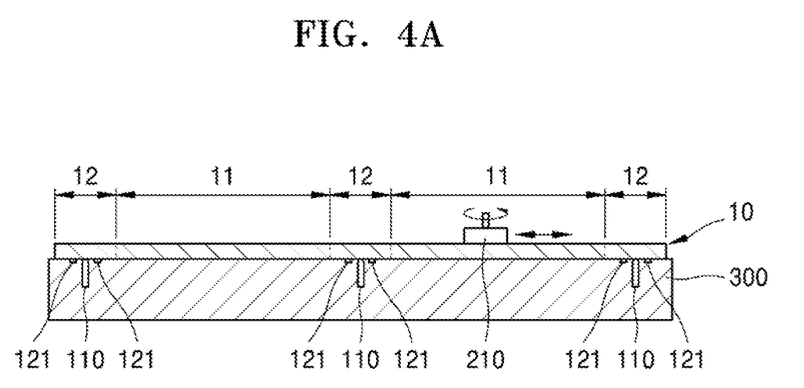
FIGS. 4A and 4B are front views that illustrate a detachment process of a substrate and a stage, according to an exemplary embodiment of the present disclosure.

First, according to an embodiment, when the substrate 10 is polished, as shown in FIG. 4A, the substrate 10 is placed on the stage 300 and a surface of the substrate 10 is polished with the polishing pads 210. Accordingly, protrusions on the surface of the substrate 10 are removed, and the substrate 10 is adhered to the stage 300 by applied pressure and heat.

Figure 4B:
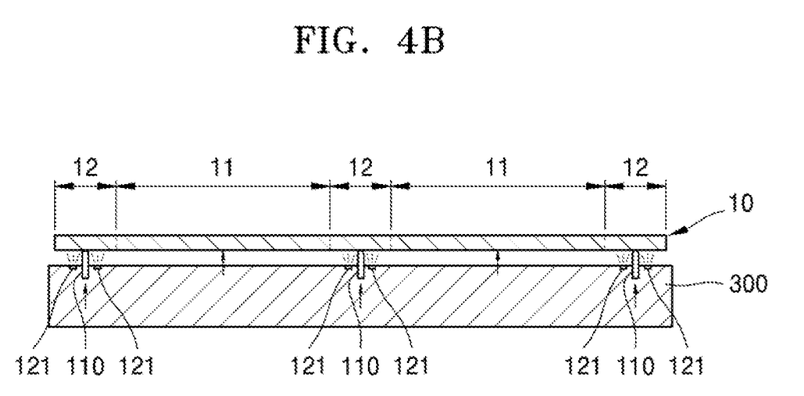

As illustrated in FIG. 4B, according to an embodiment, the lift pins 110 are raised and the substrate 10 is pushed up after the treatment is completed. At the same time, fluid is sprayed from the spray nozzles 121 and the substrate 10 is pushed up by the spraying force. Therefore, since the pushing pressure of the lift pins 110 and the spraying force of the fluid act on a plurality of portions of the substrate 10, detachment of the substrate 10 and the stage 300 proceeds smoothly and stably.

Figure 5A:
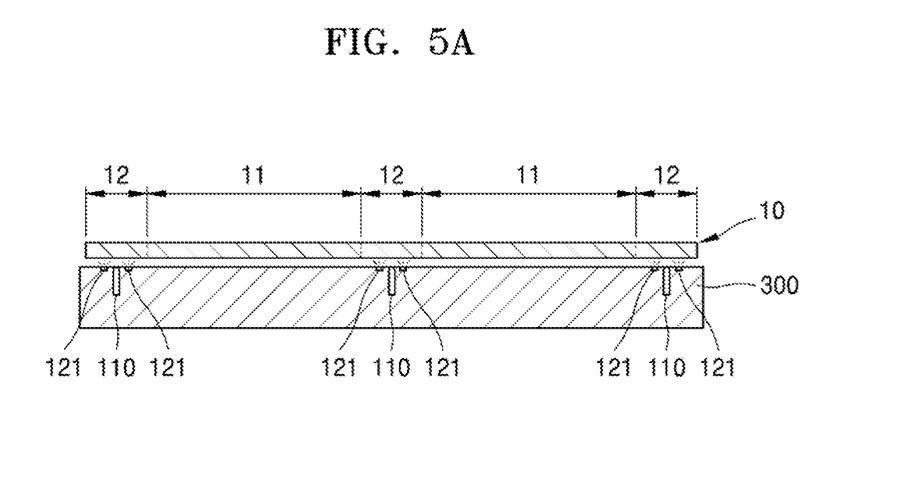
FIGS. 5A and 5B are front views that illustrate a detachment process of a substrate and a stage, according to another exemplary embodiment of the present disclosure.
Figure 5B:
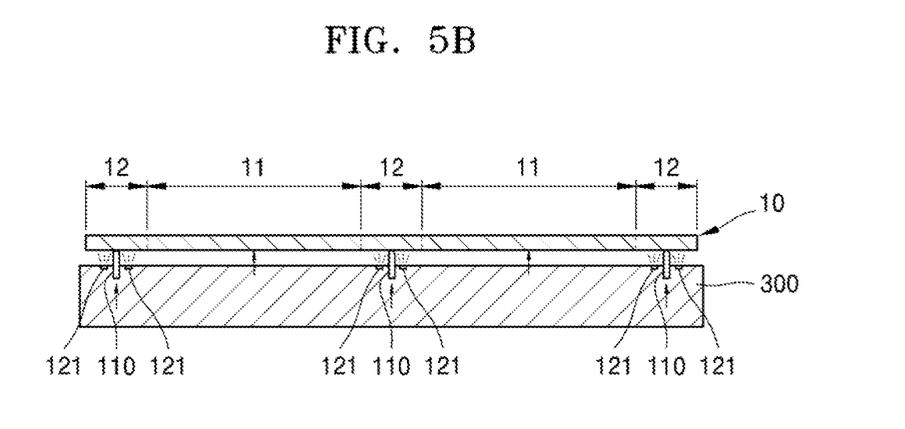

According to an embodiment, FIG. 4B illustrates a case where the lift pins 110 and the spray nozzles 121 simultaneously commence the detaching operation, but they may be sequentially operated. That is, as shown in FIG. 5A, the lift pins 110 are left as is and only the spray nozzles 121 are operated, and the substrate 10 is slightly spaced from the stage 300 by the fluid pressure. Thereafter, as shown in FIG. 5B, the lift pins 110 are lifted to add the pushing pressure so that the substrate 10 is completely detached from the stage 300. Thus, there is a time difference between the starting times of the lift pins 110 and the spray nozzles 121 operations as described above. However, embodiments are not limited thereto, and the lift pins 110 may be operated first, before the spray nozzles 121 are operated.

Figure 6A:
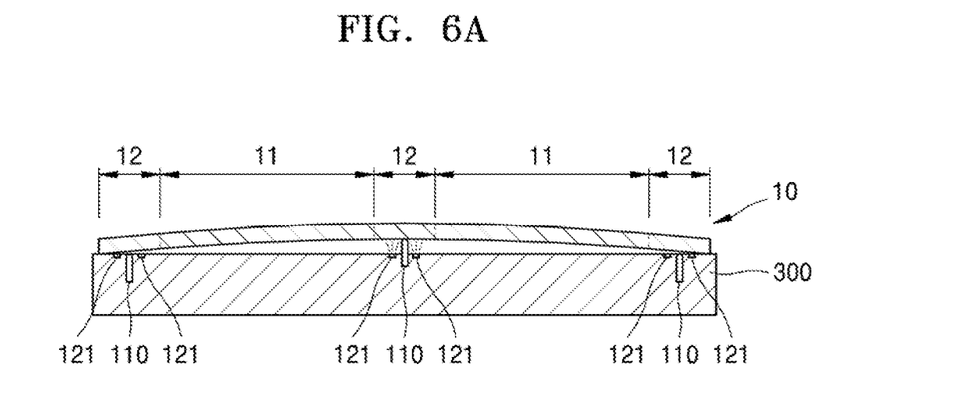
FIGS. 6A and 6B are front views that illustrate a detachment process of a substrate and a stage, according to another exemplary embodiment of the present disclosure.
Figure 6B:
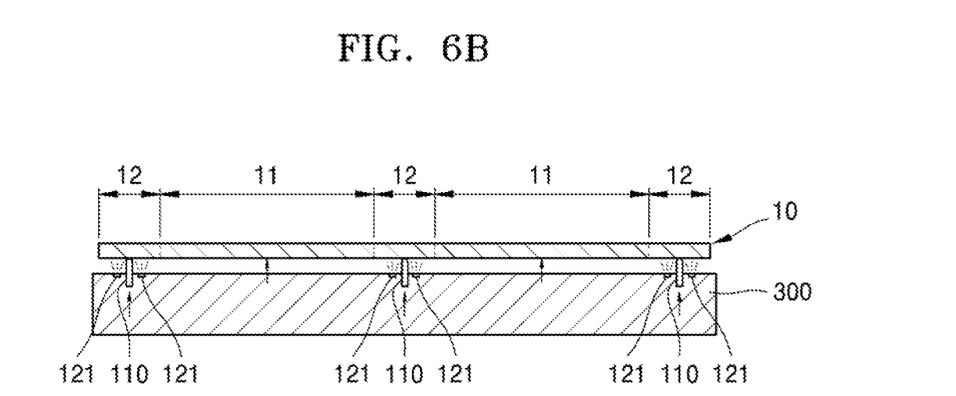

In addition, according to an embodiment, the lift pins 110 and the spray nozzles 121 can be simultaneously operated, but the starting times of the operations may differ in different locations. That is, as shown in 6A, the lift pin 110 and the spray nozzles 121 located at a center portion of the substrate 10 are operated first to detach the substrate 10 from the stage 300 only at the center portion, and then, as shown in FIG. 6B, the lift pins 110 and the spray nozzles 121 on both ends are operated to completely detach the substrate 10 from the stage 300. Thus, there is a time difference between the starting times of the operations of the lift pins 110 and the spray nozzles 121 for the different locations as described above. Similarly, embodiments are not limited thereto, and an operation sequence of the center portion and the end portions may be reversed.

According to an embodiment, even if adhesion between the substrate 10 and the stage 300 increases during the polishing operation of the substrate 10 as described above, the substrate 10 can be smoothly detached from the stage 300 using the combined force of the lift pins 110 and fluid pressure. Thus, it is possible to easily detach the substrate 10 during a detachment process, thereby reducing damage.

In a present exemplary embodiment, four spray nozzles 121 are arranged around each of the lift pins 110. However, embodiments are not limited thereto, and the number of the spray nozzles 121 may be variously increased or decreased as needed.

Therefore, according to a substrate treatment device and a substrate treatment method according to a present exemplary embodiment, since an operation of detaching a substrate from a stage proceeds by using lift pins and fluid ejection, the detaching operation can be performed more smoothly and stably. Therefore, a risk of damaging products during the detaching operation can be sufficiently reduced.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A substrate treatment method comprising:
   placing a substrate on a stage;
   treating the substrate placed on the stage; and
   detaching the treated substrate from the stage, wherein detaching the treated substrate from the stage comprises:
   pushing the substrate with a lift pin in a direction away from the stage; and
   ejecting fluid though a fluid ejection unit toward the substrate in a direction away from the stage,
   wherein treating the substrate includes polishing a surface of the substrate with polishing pads during a chemical mechanical polishing operation while supplying slurry and water.

2. The substrate treatment method of claim 1, wherein pushing the lift pin and ejecting the fluid start simultaneously during the detaching.

3. The substrate treatment method of claim 1, wherein pushing the lift pin and ejecting the fluid start at different times during the detaching.

4. The substrate treatment method of claim 1, wherein
   the lift pin and the fluid ejection unit comprise a plurality of lift pins and a plurality of fluid ejection units, respectively, that are provided to correspond to a plurality of locations of the substrate, and
   pushing the lift pins and ejecting the fluid start simultaneously at the plurality of locations during the detaching.

5. The substrate treatment method of claim 1, wherein
   the lift pin and the fluid ejection unit comprise a plurality of lift pins and a plurality of fluid ejection units, respectively, that are provided to correspond to a plurality of locations of the substrate, and
   pushing the lift pins and ejecting the fluid start at different times at the plurality of locations during the detaching.

6. The substrate treatment method of claim 1, wherein treating the substrate further includes that a reciprocating slider moves a polishing head back and forth along, the stage to polish the surface of the substrate.

\* \* \* \* \*